United States Patent [19]

Schindler

[11] Patent Number: 5,208,547

[45] Date of Patent: May 4, 1993

[54] DISTRIBUTED AMPLIFIER HAVING NEGATIVE FEEDBACK

[75] Inventor: Manfred J. Schindler, Newton, Mass.

[73] Assignee: Raytheon Company, Lexington, Mass.

[21] Appl. No.: 711,676

[22] Filed: Jun. 6, 1991

[51] Int. Cl.[5] .............................................. H03F 3/60
[52] U.S. Cl. ...................................... 330/54; 330/277; 330/53
[58] Field of Search .................... 330/54, 53, 286, 277, 330/55

[56] References Cited

U.S. PATENT DOCUMENTS 4,543,535  9/1985  Ayasli ..................................... 330/53
4,788,511  11/1988  Schindler ............................... 330/54
4,841,253  6/1989  Crabill .................................... 330/54

Primary Examiner—Robert J. Pascal
Assistant Examiner—Tan Dinh
Attorney, Agent, or Firm—Richard M. Sharkansky

[57] ABSTRACT

A radio frequency amplifier including a plurality of field effect transistors having input electrodes successively coupled by an input propagation network and output electrode successively coupled by an output propagation network is described. The radio frequency circuit includes a feedback circuit, preferably a plurality of feedback circuits, each one being disposed about a corresponding one of the plurality of transistors to provide a negative feedback path about each one of said transistors.

11 Claims, 7 Drawing Sheets

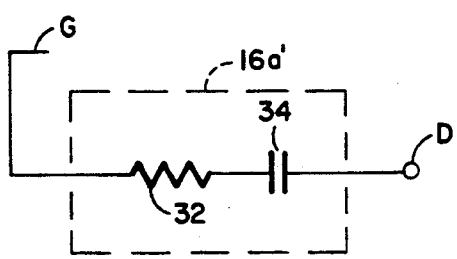
Fig. 1A
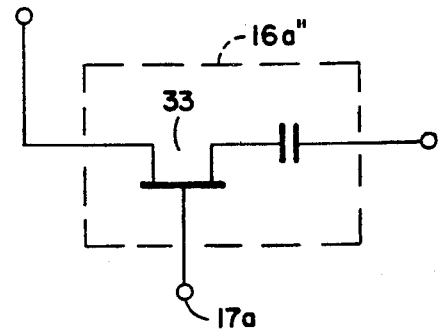
Fig. 1B
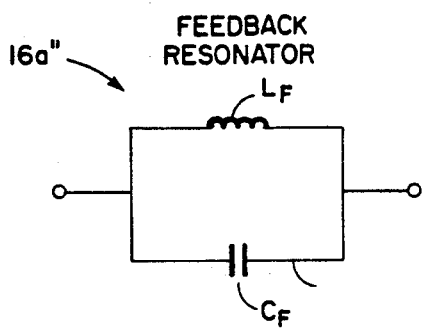
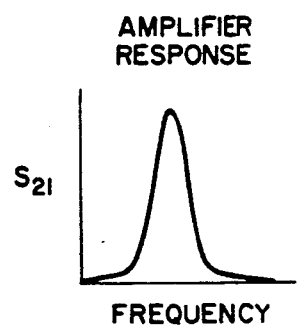
Fig. 1C
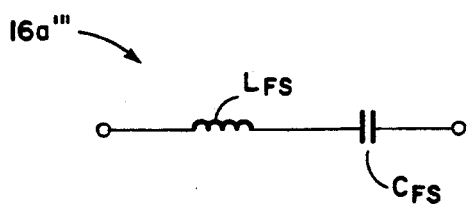
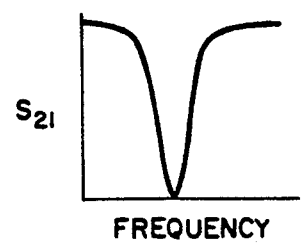
Fig. 1D

5,208,547

DISTRIBUTED AMPLIFIER HAVING NEGATIVE FEEDBACK

BACKGROUND OF THE INVENTION

This invention relates generally to microwave circuits and more particularly to distributed microwave circuits.

As is known in the art, radio frequency distributed amplifiers including a plurality of successively interconnected field effect transistors are used to provide amplification of radio frequency signals. Such amplifiers are, in particularly, used in applications requiring broad frequency bandwidths of operation.

In a conventional distributed amplifier, an input propagation network successively couples input electrodes of a plurality of field effect transistors, for example, and an output propagation network successively couples output electrodes of the plurality of field effect transistors. Since field effect transistors have intrinsic input capacitance and output capacitance, in general, the presence of these capacitances limits the bandwidth of operation of the FET when used in an amplifier. However, with the distributed approach, the input and output capacitances of the FET become part of the propagation networks forming artificial transmission lines. In this manner, major band limiting effects of the input and output capacitances of the transistors in reducing frequency bands of operation of the amplifier are avoided.

Negative feedback is a commonly applied technique in low frequency amplifiers. Negative feedback is often used in a low frequency amplifier to provide, amongst other things, amplifiers having relatively low level distortion. There are many examples of negative feedback employed in low frequency amplifiers whereas at high frequencies, such as microwave frequencies, beyond about 1-2 gigahertz, for example, the examples of negative feedback are relatively few. In particular, those examples of negative feedback used at microwave frequency are generally confined over very narrow frequency bands of operation. One problem which has prevented use of negative feedback at microwave frequencies, particularly over broad frequency band of operation, is that the phase shift of a feedback path is related to the phase length of the signal path, as well as, the phase of the signal at the output of the amplifier. At microwave frequencies the electrical pathlength between the output and input of the amplifier may be appreciable, thus resulting in a variation in phase shift which is a function of frequency. Moreover, stability of such an amplifier is also a problem since positive feedback may also occur at some frequencies.

Further complicating the use of negative feedback at microwave frequencies is that approaches such as monolithic microwave integrated circuits provided as microwave amplifiers and other circuit elements use metal semiconductor field effect transistor (MESFET) or high electron mobility transistors (HEMTs) having gallium arsenide or other Group III-V material as an active layer as an active element of the circuit. Such devices are inverting devices. That is, the output signal is 180° out of a phase with the input signal. Because of their parasitic capacitances, however, insertion phases vary significantly from 180° at microwave frequencies. It is not uncommon, therefore, to have a field effect transistor which will have an insertion phase near 180° below 1 GHz, but will drop down to 90° at 10 GHz.

SUMMARY OF THE INVENTION

In accordance with the present invention, a radio frequency circuit includes a plurality of field effect transistors, each one of said transistors having an input electrode and an output electrode. Said circuit further includes input propagation means for successively coupling the input electrodes of each of said transistors to an input terminal of said radio frequency circuit and output propagation means for successively coupling the output electrodes of each one of said transistors to an output terminal of said circuit. The distributed circuit further includes feedback means disposed between the input electrode of at least one of said plurality of transistors and the output electrode of said at least one transistor for providing a feedback path between said output electrode and said input electrode of said at least one transistor. With such an arrangement, a radio frequency circuit having a plurality of successively coupled transistors and a feedback circuit disposed between input and output electrodes of at least one of said plurality of transistors is provided. Such a distributed circuit may include various types of feedback circuits to accomplish various circuit functions. For example, by providing a 180° phase shift over a broad range of operating frequencies, a negative feedback distributed amplifier having low levels of distortion is provided. In another embodiment, the feedback elements may be resonance circuits having selected frequency responses to provide a filter function for the negative feedback amplifier. In another embodiment, the feedback means may be circuits which introduce a variable phase shift. One example would include a varactor diode which provides a variable capacitance. Such a variable capacitance element may be controlled by feeding a variable bias voltage to the varactor to control the capacitance thereof. Such a circuit could be used as a filter having a variable filter response. Moreover, the feedback elements may include a variable capacitance element such as a varactor diode and provide a tunable recursive element, therefore, such an arrangement can be used to provide tunable recursive type networks. Further still, the feedback elements may be a resistor to provide an attenuator and, more particularly, may be voltage controllable resistors which provide a variable attenuator.

In accordance with a further aspect of the present invention, a radio frequency distributed circuit includes a plurality of successively coupled transistors each one of said transistors having an input electrode and an output electrode, an input propagation network for successively coupling the input electrodes of each one of said transistors to an input terminal of said circuit and output propagation network for successively coupling the output electrodes of each of said plurality of transistors to an output terminal of the circuit. The circuit further includes a plurality of field effect transistors each having an input or control electrode, a first output electrode, and a second output electrode with the first and second output electrodes disposed to couple the drain electrode of one of said transistors with its corresponding gate electrode. With such an arrangement, a distributed circuit having negative feedback elements disposed about each of the field effect transistors is provided. By selecting the characteristics of the feedback elements, a circuit having a relatively low level of distortion over a broad range of frequencies is provided.

BRIEF DESCRIPTION OF THE DRAWINGS

The foregoing features of this invention, as well as the invention itself, may be more fully understood from the following detailed description of the drawings, in which:

FIGS. 1A-1D are schematic representations of alternate circuit elements for the feedback circuits of the distributed amplifier shown in FIG. 1;

DESCRIPTION OF THE PREFERRED EMBODIMENTS

Figure 1:
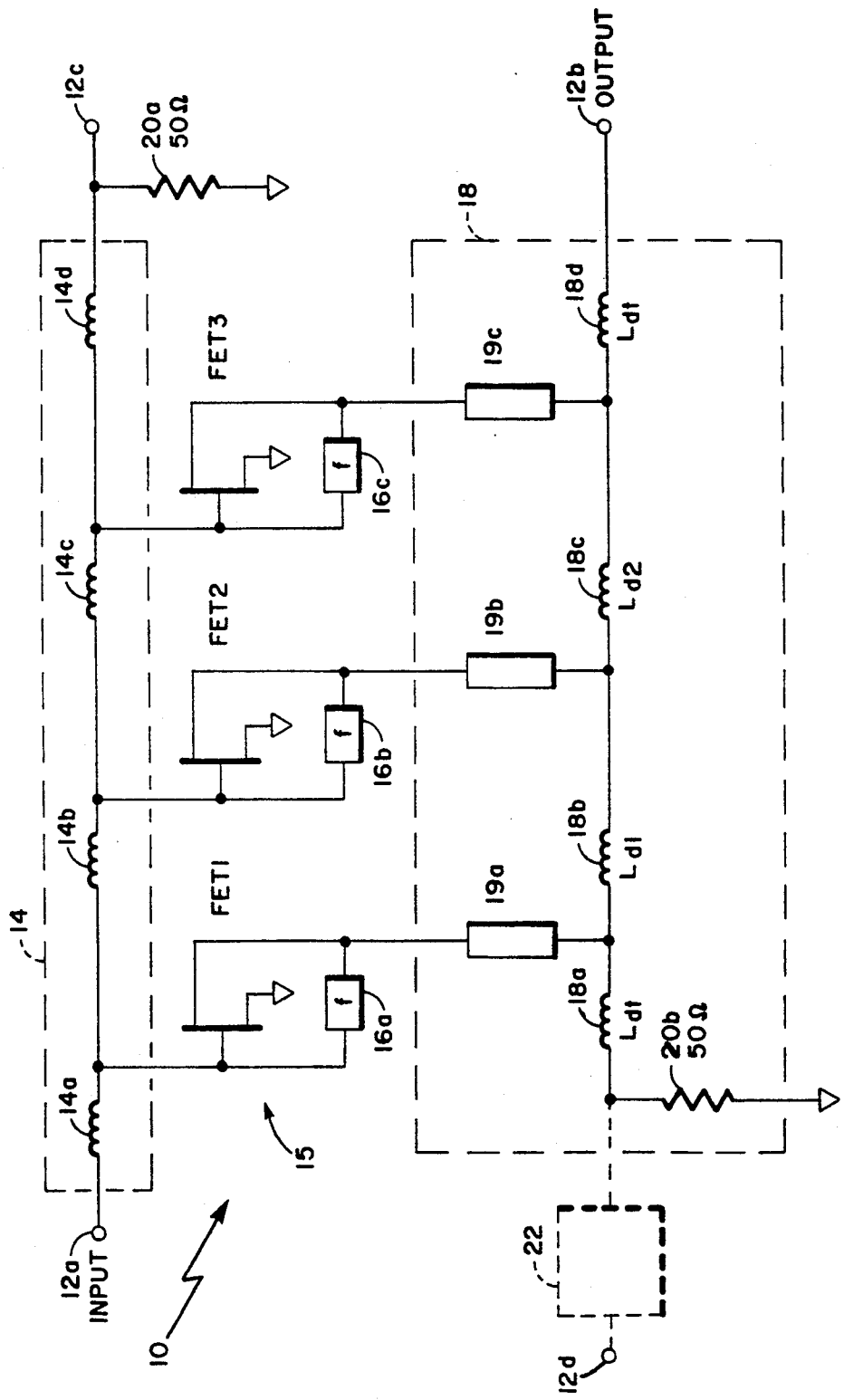
FIG. 1 is a schematic diagram of a distributed amplifier having negative feedback elements disposed about each of the transistors of the amplifier.

Referring now to FIG. 1, a negative feedback amplifier 10 is shown having an input terminal 12a, an output terminal 12b, a gate bias terminal 12c, and a drain bias terminal 12d. The amplifier 10 further includes a input propagation network 14 here comprised of transmission line sections 14a-14d, 14d, here provided as sections of high impedance transmission lines coupled between terminals 12a and 12c, as shown. The transmission lines have lengths l here equal to $l_{Gi}$, $l_{G1}$, $l_{G2}$, and $l_{Gi}$, respectively. The amplifier 10 further includes a plurality of here three field effect transistors FET1-FET3, each of said transistors having gate (G), drain (D), and source (S) electrodes as shown for FET1. The gate electrodes (G) of the plurality of transistors 15 are successively coupled via the transmission lines sections 14a-14d, as shown, between the input electrode 12a and the bias terminal 12c. The amplifier 10 further includes an output propagation network 18 here comprised of transmission lines sections 19a-19c and a second plurality of transmission line sections 18a-18d. Transmission line sections 19a-19c are optionally used to couple the drain electrode (D) of each one of the transistors to the transmission lines sections 18a-18d, as shown. Likewise, transmission lines 18a-18d have electrical pathlengths corresponding to $l_{Di}$, $l_{D1}$, $l_{D2}$, and $l_{Do}$, respectively. Transmission lines sections 18a-18d are successively coupled between an output terminal 12b and a drain bias network 22, which is coupled between the end of transmission line 18a and a drain bias terminal 12d, as shown.

The amplifier 10 further includes feedback elements 16a-16c disposed to be electrically coupled between the input or gate electrode (G) and the drain or output electrode (D) of each one of the transistors FET-1-FET3, as shown. In accordance with the particular application of the circuit 10, the feedback elements 16a-16c can be any one of a number of circuits to provide a corresponding circuit function. For example, the elements 16a-16c may be provided by a resistor as shown in FIG. 1A. Here a film resistor 32 such as one fabricated from a high resistivity material may be disposed with a DC blocking capacitor 34 in series as shown. Alternatively, the resistor may be a field effect transistor operating or functioning as a resistor that is operating in a passive mode without drain to source bias. Such a transistor 33 is coupled with a DC blocking capacitor 34 between gate and drain electrodes of each one of the field effect transistors FET1-FET3. It is to be noted that DC blocking capacitor 34 is used to isolate the bias voltages in gate and drain circuits. It's presence is preferred but not always necessary.

In this manner, the feedback elements 16a'-16c' or "16a-16c" will couple a portion of the output signal back to the input signal and cancel a certain portion of the input signal thus reducing the gain of the amplifier but also concomitant therewith increasing stability and reducing distortion in the amplifier. Negative feedback is a commonly applied technique for distortion reduction in low frequency amplifiers. In an ideal negative feedback amplifier for a given output gain, the level of distortion products, is reduced by amount that gain is reduced. The negative feedback distributed amplifier described in conjunction with FIG. 1 provides the plurality of feedback paths between the output electrodes of each one of the corresponding plurality of field effect transistors and the corresponding input electrodes of the field effect transistors.

This approach differs from approach in which negative feedback is provided around the entire amplifier. In a broadband microwave amplifier such as a distributed amplifier described in conjunction with FIG. 1, such an approach of providing a feedback path around the entire amplifier, that is, between the output terminal 12b and the input terminal 12b is not feasible since the insertion phase provided by any such feedback path will deviate substantially from 180° over a broad range of operating frequencies. Negative feedback implemented in such a manner having insertion phase substantially equal to 180° is only practical over relatively narrow frequency bands using a feedback circuit between input and output terminals of the amplifier. In some frequency bands, moreover, the insertion phase may be 0°, that is, positive feedback. Positive feedback introduces instabilities into the amplifier. The circuits 16a-16c, described above, diminish the effects of the field effect transistors parasitic inductance and capacitance since the feedback path provided by such feedback circuits 16a-16c bypass the matching circuits of the amplifier. Moreover, the feedback path is short and direct being disposed between the gate and drain electrodes of the field effect transistor or selective over the transistor and may be provided simply by a resistor and a DC blocking capacitor connected in series as shown in FIG. 1A.

Alternatively, capacitor may be disposed in the gate circuit to provide DC blocking. Referring now to FIGS. 1, 1B, a feedback network 16a', which may be used to replace feedback networks 16a-16c (FIG. 1) is shown. Here network 16a" and each of said networks 16b', 16c' include a variable resistor which is provided as a field effect transistor operating without drain bias, but with a gate bias to control selectively conductance between drain and source electrodes, and is disposed in series with a DC blocking capacitor, as generally shown. As with the fixed resistor embodiment described in conjunction with FIGS. 1, 1A here the variable resistor embodiment is also provided by a field effect transistor operating in a passive or resistive mode. Here, however, rather than a gate electrode being open circuited, the gate electrode is coupled to a control signal terminal, as shown, to provide selective control to each one of the elements of the feedback network 16a–16c, as shown.

A third embodiment 16a''' of the feedback networks 16a–16c, generally described in conjunction with FIGS. 1, is shown in FIG. 1C to include a parallel resonance circuit comprised of a inductor $L_{FP}$ disposed in parallel with a capacitor $C_{FP}$, as shown. Network 16a'' provides a parallel resonance circuit having a narrow passband frequency response. If one of the elements, such as, for example, the capacitor $C_{FP}$ is replaced by a variable capacitor, as, for example, by a varactor diode, the frequency response of the network can be altered.

Referring now to FIG. 1D, a further embodiment of a feedback network 16a–16c is here shown to include a inductor $L_{FS}$ disposed in series with a capacitor $C_{FS}$ to provide a series resonance circuit 16a''''. This circuit will provide an amplifier having a narrow notch or bandstop filter response. As with the circuit described in conjunction with FIG. 1C, one of the elements, such as, for example, the capacitor element may be replaced by a variable capacitor element, as, for example, a varactor diode to provide a variable frequency response to the circuit.

Figure 2:
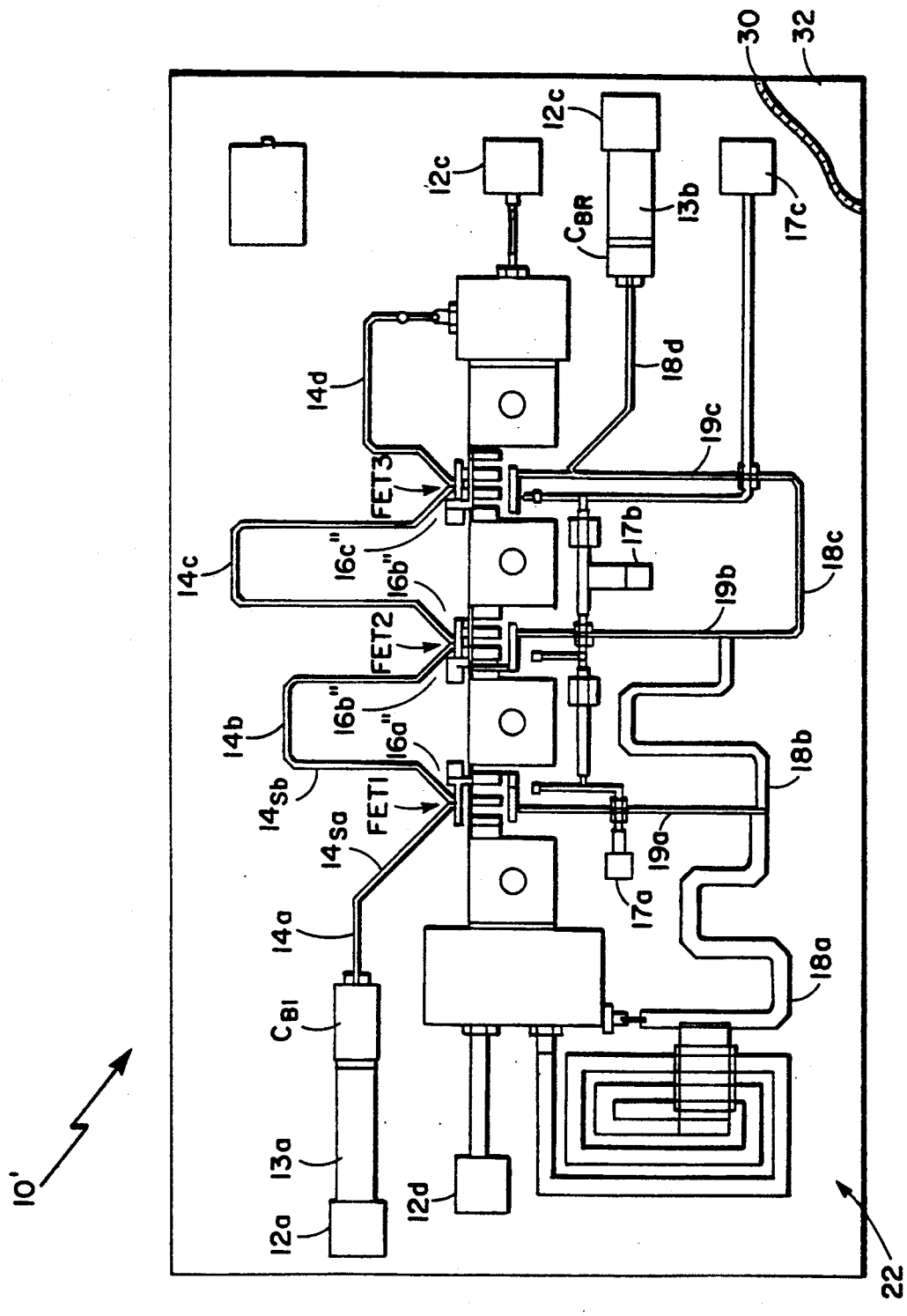
FIG. 2 is a plan view of a typical implementation of a distributed negative feedback distributed amplifier fabricated as a monolithic microwave integrated circuit.

Referring now to FIG. 2, an illustrative implementation of the circuit generally described in conjunction with FIG. 1B, that is, a negative feedback distributed amplifier having selective variable feedback, which may be used as an amplifier, or alternatively as an attenuator is shown. The circuit 10' is disposed on a semi-insulating substrate 30 being comprised of gallium arsenide or other suitable Group III–V material particularly adapted for use at microwave frequencies, and having disposed over a bottom surface thereof a ground plane conductor 32, here comprised of gold and suitable attached to said substrate 30 as using techniques well known in the art. Disposed over here upper surface of the substrate 30 is the circuit 10'. The circuit 10' is shown having an input terminal 12a which corresponds to terminal 12a in FIG. 1 and which is coupled here via a transmission line 13a to a DC blocking capacitor $C_{DC1}$. Transmission line 13a generally has a characteristics impedance corresponding to the system characteristic impedance in which the amplifier 10, is disposed which is typically 50 ohms. The other end of series DC blocking capacitors $C_{DC2}$ is coupled to the transmission line section 14a, as also described in conjunction with FIG. 1. The transmission lines 14a–14d are used to successively couple gate electrodes of the field effect transistors FET1–FET3, as shown. The transmission lines are selected to have a characteristic impedance in accordance with the impedance characteristics of the inputs of said transistors to provide a network having an overall characteristic impedance substantially equal to the characteristic impedance of here transmission line 13a. The drain or output electrodes of transistors FET1–FET3 are successively coupled via output propagation networks comprised of transmission lines sections 19a–19c and 18a–18d as generally described in conjunction with FIG. 1. Suffice it here to say, therefore, that each of the transmission lines generally described in conjunction with FIG. 2 and FIG. 1 are here provided as microstrip transmission lines having a patterned strip conductor such as strip conductor $14_{SA}$ disposed over the semi-insulating gallium arsenide substrate 30 and which provides in combination with the ground plane conductor disposed thereover a microstrip transmission line. The last transmission line section $18_d$ is disposed to couple the drain electrode of FET3, as well as, the preceding electrodes of FET1 and FET2 to the output terminal 12b via a second DC blocking capacitor $C_{O2}$ and a second transmission line 13b here also having a characteristic impedance substantially equal to the system characteristic impedance and typically being 50 ohms.

Feedback elements 16a–16c are disposed adjacent corresponding transistors FET1–FET3 to provide a relatively short feedback path at microwave frequencies between gate and drain electrodes of each one of the respective transistors FET1–FET3. Here the feedback elements are implemented as field effect transistors operating in a passive mode, and have gate or control electrodes thereof coupled to respective terminals 17a–17c to provide selective control of the resistance of each one of the channels of the transistors and thus control selectively the degree of feedback provided around each one of the transistors FET1–FET3. Such an arrangement may be used to provide a distributed amplifier having degenerative feedback or negative feedback to provide distributed amplifier 10' having a low level of distortion in the output signal, or alternatively may provide a distributed amplifier which may be used, for example, as a voltage controlled attenuator.

Figure 3:
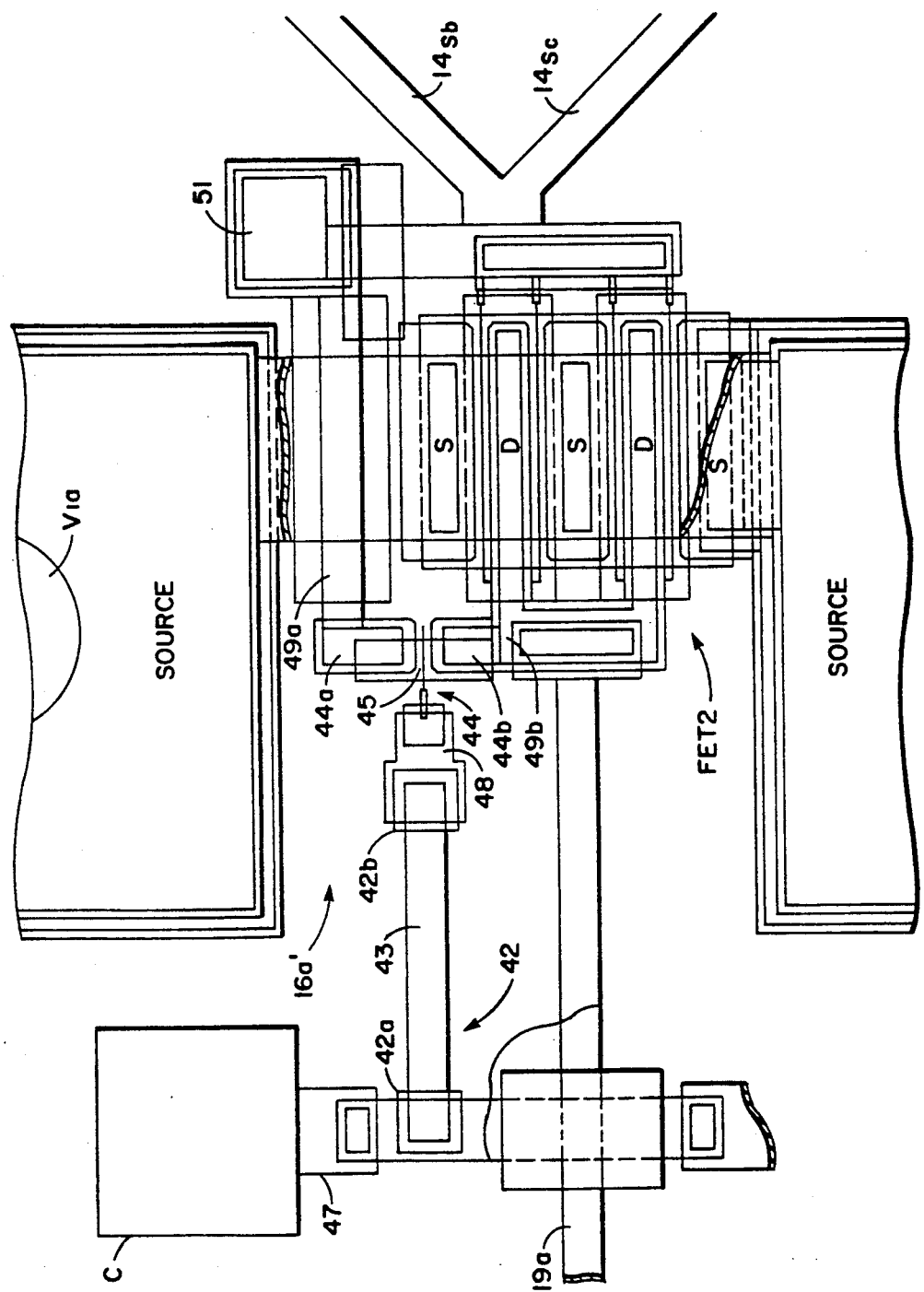
FIG. 3 is a blown up plan view of a portion of a circuit taken along the line 3—3, FIG. 2.

Referring now to FIG. 3, an illustrative one of the feedback elements here element 16a'' having an isolation resistor is shown coupled to a field effect transistor FET1. Isolation resistor 42 is here provided as a field effect transistor operating in a passive mode without drain or gate bias. Isolation resistor 42 is disposed in the control signal path of the coupled element of the feedback resistor to prevent large amounts of the RF signal which is fed back from being coupled to the control terminal. That is, transistor 42 has a semiconductor doped region 43 with ohmic contacts 42a, 42b which generally correspond to source and drain contacts disposed at opposing ends of the region 43, as shown. Contact 42a is coupled via a transmission line section 47 and capacitor C to a control terminal 17a (FIG. 2), whereas contact 42b is coupled via a short transmission line section 48 to gate electrodes of the feedback transistor 44. Here the feedback transistor 44 also operates in a passive mode and provides a voltage controlled variable resistance in the feedback circuit 16c. Here transistor 44 includes a doped semiconductor region 45 having disposed over opposite ends thereof ohmic contacts 44a, 44b generally equated to source and drain contacts and which are coupled via lines 49a, 49b to gate and drain electrodes of field effect transistor FET2, respectively as shown. Field effect transistor FET2 is any conventional field effect transistor adapted for use to amplify microwave signals for example. The transistor FET2 further has conventional "source," "drain," and "gate" pads as shown interconnecting source, drain, and gate contacts, as is known. A DC blocking capacitor 51 is shown coupled between the gate port of FET2 and line 49. Further here a source overlay 52 is provided to interconnect source contacts. Here semiconductor regions 43 and 45 are each selectively doped to provide a selective resistance characteristic. For example, the bias isolation resistor has a length and is typically doped to provide a resistor having a resistance value of approximately 1,000 ohms and thus would have a dopant concentration in the range of $1 \times 10^{17}$ to $1 \times 10^{18}$ a/cc whereas feedback resistor 44 is typically doped to provide a resistor having a value resistance typically in the range of 100 ohms to 10,000 ohms and has a dopant concentration in the above range and which when fed a control voltage at pad 17a through bias resistor 42 provides a selective resistance characteristic between terminals 44a, 44b in accordance with the value of the voltage signal fed to the gate electrode 47, as well as, the dopant concentration of the semiconductor layer 45, length, and width of the layer as would be apparent to one of ordinary skill in the art.

In the embodiments described above, the basic circuit is designed to maintain a substantially constant phase difference of 180° around each FET over the operating bandwidth of the amplifier. In general, this design technique requires a modelling of phase differences for each FET over the desired frequency band. The distributed amplifier having substantially 180° phase difference over the frequency band is provided by adjusting circuit elements to compensate for nonlinearities in the amplifier. In a typical distributed amplifier, for example, all the gate line inductances are the same, as well as, the drain line inductances and drain matching elements. By varying the values of such elements, close to 180° phase shift differential across each field effect transistor is provided over the operating frequency band. By having a standard model of the transmission lines, capacitors, and field effect transistors, as well as other circuit elements incorporated into the circuit, such elements can thus be modelled on a microwave design software package to provide a design having the desired 180° phase difference.

Figure 4:
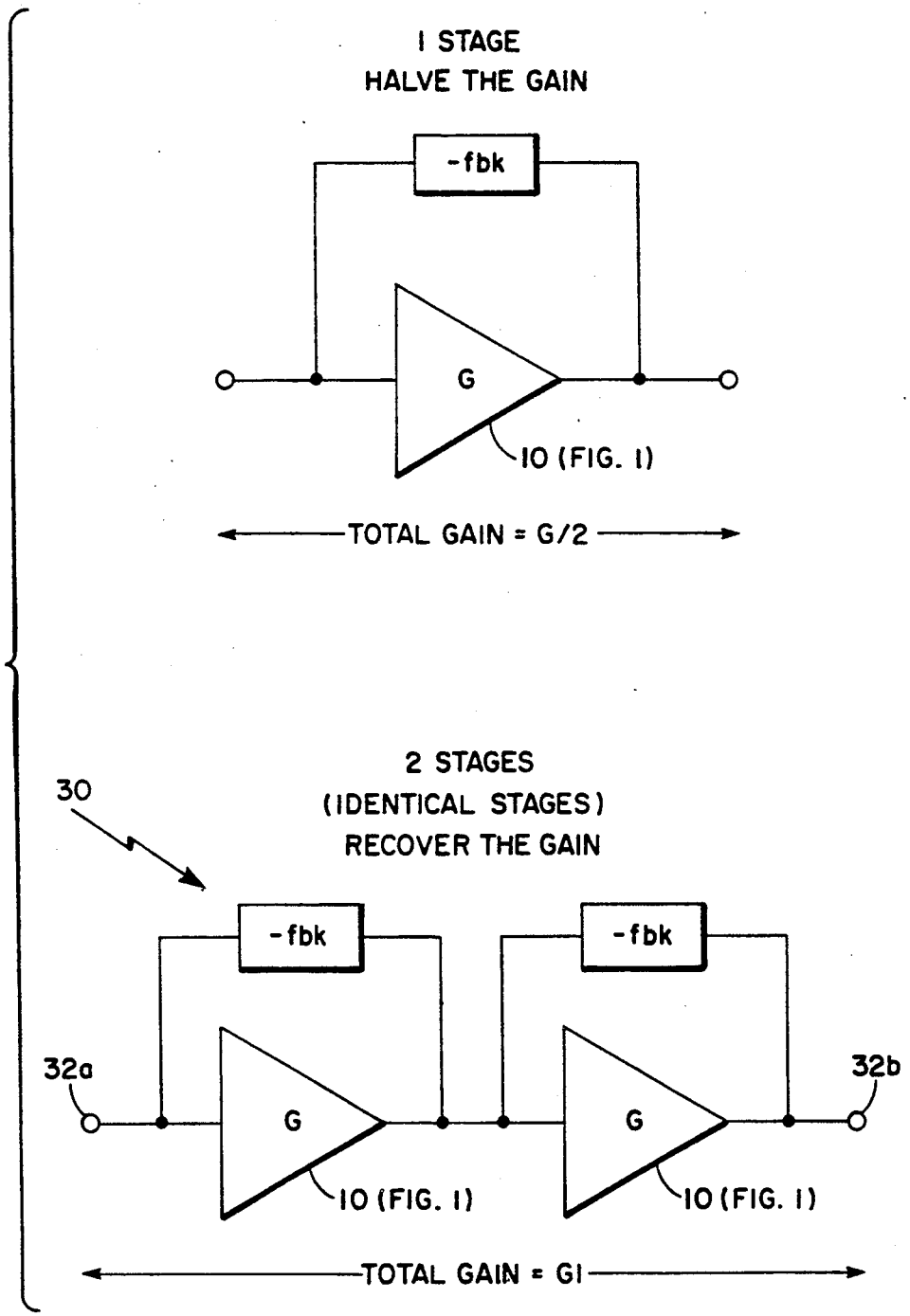
FIG. 4 are block diagrams showing different configurations of stages of negative feedback distributed amplifiers to provide high gain.

The negative feedback amplifier provides a feedback path around each of the individual transistors rather than around the entire amplifier. This approach provides a broadband microwave amplifier having negative feedback. One drawback from this approach, however, is that since a portion of the output signal is fed back to the input signal having an inverse phase relationship, the overall gain of each one of the transistors is reduced. To recover reduced gain and still maintain low distortion levels, generally a driver amplifier stage is added to the low distortion stage as generally shown in conjunction with FIG. 4. Since the output power from the driver stage is lower than the output power from the original stage, the distortion levels from the overall amplifier are relatively low. Useful amplification performance can be provided from such an amplifier if the initial amplification stage has sufficient gain before feedback is provided. That is, the reduction in gain must still provide an amplifier having enough overall gain to allow for low distortion from any driver stage.

Figure 5:
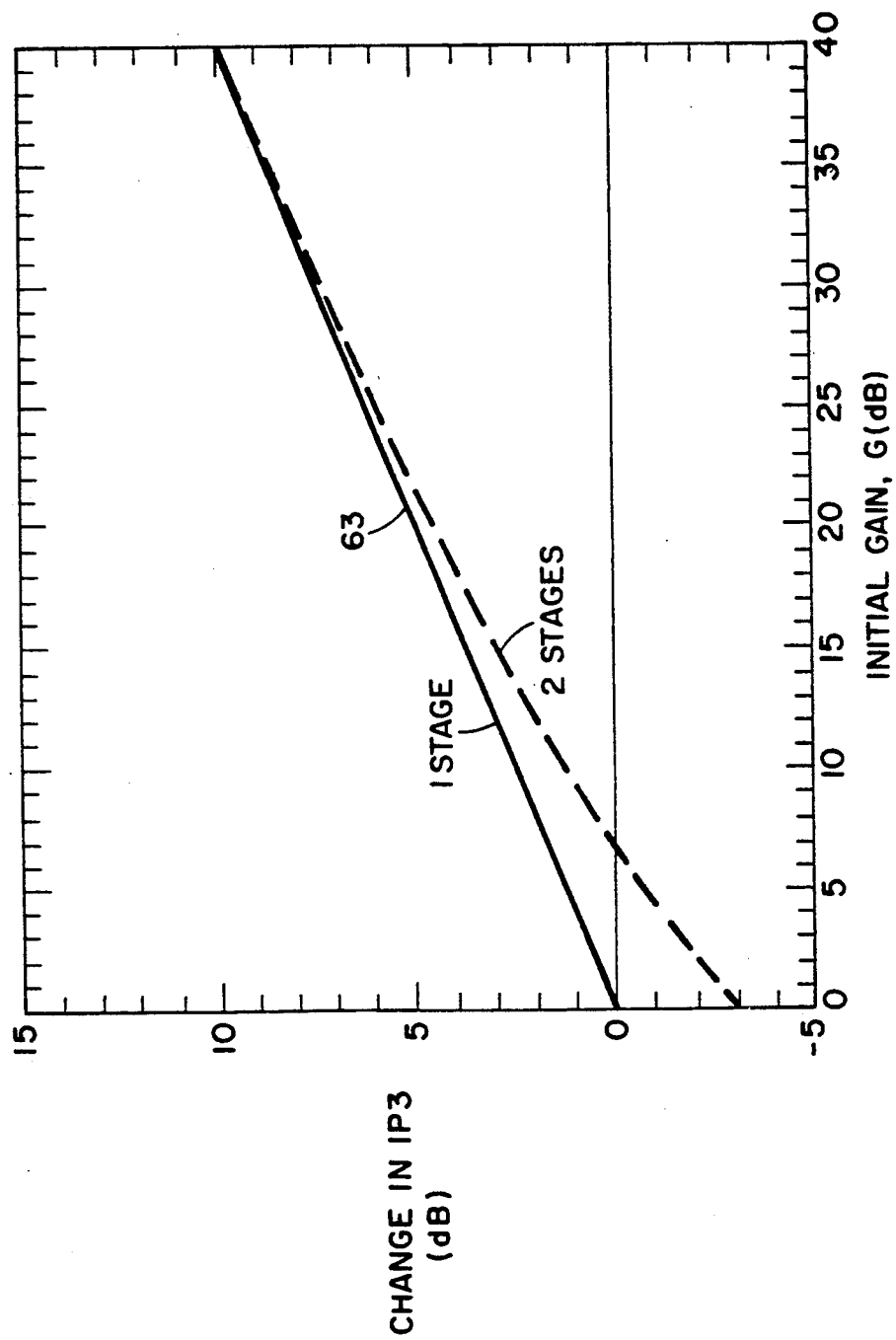
FIG. 5 is a plot of change in third order intercept vs. initial gain which is useful in understanding the present invention.

Referring now to FIG. 5, the total distortion level of two identical negative feedback amplifiers cascaded together is shown. The negative feedback of each stage is sufficient to cut the gain of such stage in half. The curved marked 63 represent the reduction in distortion using the third order intermodulation product (IP3) as gain is reduced. A one dB improvement in the third order intercept point IP3 represents a 2 dB in reduction in distortion levels. Thus, for an initial gain of 40 dB when gain is halved distortion is reduced by 20 dB resulting in a 10 dB improvement in IP3.

When a second driver stage is added to recover gain associated with the first driver stage, its distortion adds to the distortion of the output stage. When the initial gain is high, therefore, such as 40 dB, the output power of this first stage is sufficiently low such that it does not add significantly to total distortion. On the other hand, where the gain is zero, the distortion of the two stages add directly. This situation doubles the distortion causing a 3 dB degradation in IP3. Accordingly, the breakeven point for this arrangement is having an initial gain of 6.8 dB, but as a practical matter the initial gain should be well above this level to make negative feedback practical.

In general, for negative feedback distributed amplifies using present technology operation of such circuits at lower frequencies is possible with relatively high gain. Thus, this technique is, at present, more appropriate at lower frequencies. This is simply due to the present circumstance that active devices such as MESFETs have relatively low gain at very high frequencies. As devices improve in gain performance low distortion amplification using the present techniques will be more practical at higher frequencies. Further, however, the use of higher gain devices such as high electron mobility transistors (HEMTs) comprised of aluminum gallium arsenide/gallium arsenide active regions or pseudomorphic high electron mobility transistor comprised of aluminum gallium arsenide/indium arsenide active regions can also make negative feedback distributed amplifiers more practical for higher frequencies.

As also mentioned above, an alternative application for the negative feedback amplifiers is in use as an active variable attenuator having a constant phase characteristic. The negative feedback distributed amplifier generally described in conjunction with FIG. 1 and FIG. 1B can provide gain control over an octave of bandwidth with less than 15° phase shift or about twice as good as a passive attenuator. This can be provided by having a variable resistor disposed in the feedback path of the circuit.

Figure 6:
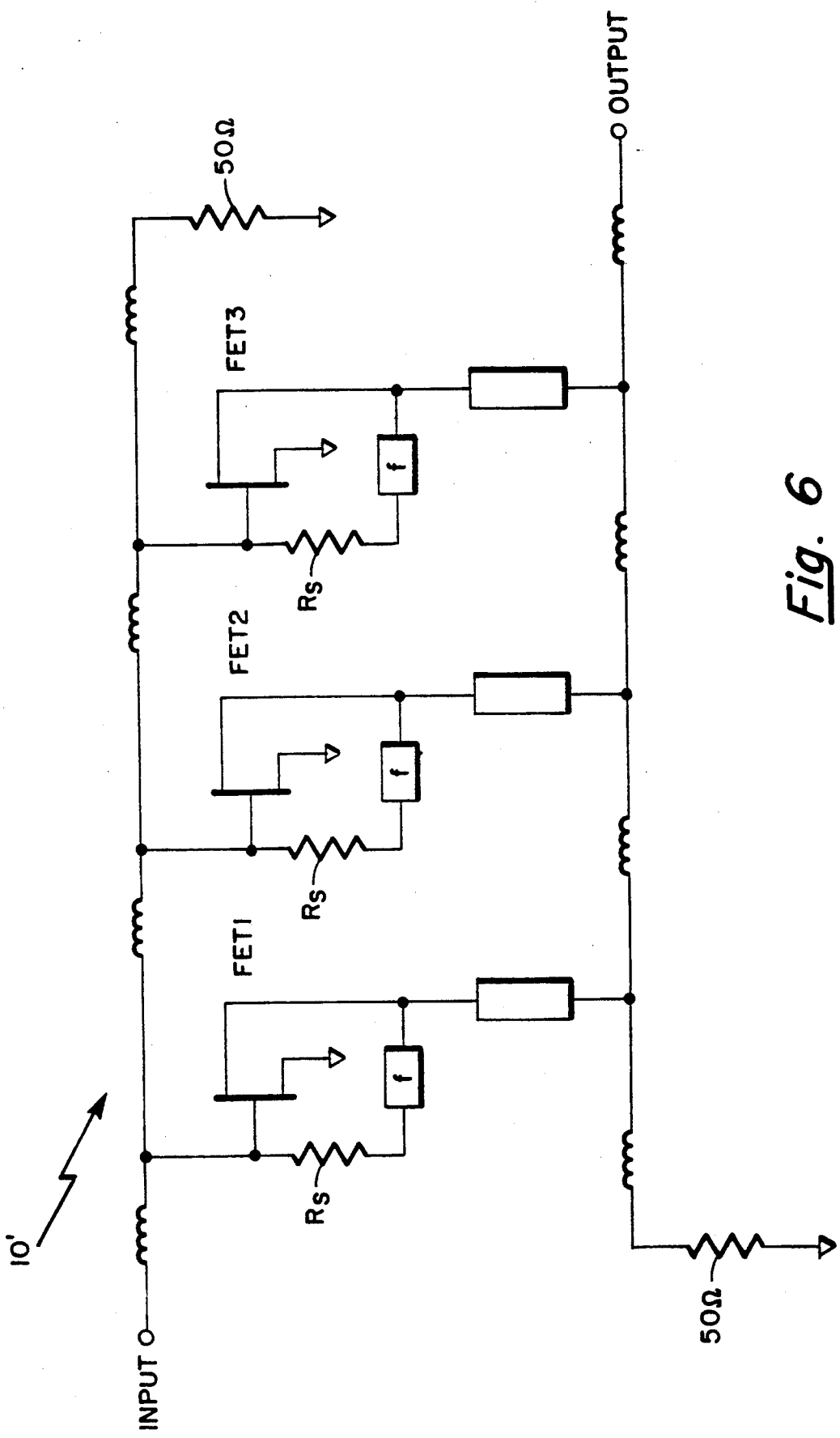
FIG. 6 is a schematic representation of a negative feedback distributed amplifier having stabilizing resistors in accordance with a further aspect of the present invention.

Alternatively, the negative feedback amplifier can be used as a notch or bandpass filter by providing circuit elements in the feedback paths having selective frequency responses. For example, the circuit elements could be either series or parallel resonance circuits to provide either bandpass or bandstop or band reject filter characteristics. Moreover, since the circuit uses negative feedback paths, it could also be used as a recursive type of element. In each of the latter embodiments, particularly when using resonance circuits, it is generally desirable to reduce instabilities by providing a stabilization resistor in the feedback path. As shown in FIG. 6, each one of the feedback circuits 16a–16c of an amplifier 10' generally similar to circuit 10 (FIG. 1) includes a stabilizing resistor $R_s$ in the feedback path. Generally $R_s$ is likewise a passive metal semiconductor FET or metal film or HEMT and has a value of resistance of typically 20–100 ohms.

In order to achieve a bandpass filter response, a parallel LC resonance circuit is used. If the same LC resonance circuit is used for each of the field effect transistors, such as the three shown in conjunction with FIG. 1, a relatively narrow passband would be provided. If it is desired to have a broader passband, the three resonance circuits having selected, staggered values of capacitance and inductance to staggered slightly the frequency responses of the circuit and provide in a broader response. Optionally, the capacitors may be provided as varactor diodes and thus provide variable capacitors with which an adjustable bandwidth may also be provided.

The rejection characteristic of the filter as described above is about 20 dB. To achieve additional rejection additional filter sections may be cascaded and the rejection would generally be additive in nature.

To fabricate a tunable recursive filter response, field effect transistors and varactor diodes would preferably be integrated on a single chip. One technique which may be used to provide this arrangement would be to provide a high performance varactor diode disposed over a field effect or high electron mobility transistor. The source and drain contact layers for the field effect transistors will be provided as indium gallium arsenide. Molecular beam epitaxial techniques may be used to grow each of the layers required for both the field effect transistor and varactor diode structures. With the use of indium gallium arsenide as a contact layer, the indium gallium arsenide may also be used as an etch stop layer to effectively permit isolation of the varactor diode active regions from the underlying field effect transistor active regions.

Alternate arrangements for feedback networks are, of course, possible. For example, distributed power amplifiers employing gate coupling capacitors, as described in U.S. Pat. No. 4,543,535 assigned to the assignee of the present invention, and incorporated herein by reference, can be configured to provide negative feedback around the gate coupling capacitor and amplifying transistor element. This could be accomplished, for example, by providing a MESFET with its drain electrode coupled to the input transmission line of the amplifier and the source electrode thereof coupled to the drain electrode of the amplifying transistor. Thus, in this configuration, the gate coupling capacitor can be used for D blocking. The feedback is thus provided around the capacitor and the amplifying transistor.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A radio frequency circuit, comprising:
   a plurality of field effect transistors, each one of said transistors having an input electrode and an output electrode;
   input propagation means for successively coupling the input electrodes of each one of said transistors to an input terminal of said radio frequency circuit;
   output propagation means for successively coupling the output electrodes of each one of said transistors to an output terminal of said circuit; and
   feedback means disposed between the input electrode and the output electrode of at least one of said transistors for providing a negative feedback path about said at least one transistor.

2. The circuit, as recited in claim 1, wherein said feedback path means includes a resistor.

3. A radio frequency circuit, comprising:
   a plurality of field effect transistors, each one of said transistors having an input electrode and an output electrode;
   input propagation means for successively coupling the input electrodes of each one of said transistors to an input terminal of said radio frequency circuit;
   output propagation means for successively coupling the output electrodes of each one of said transistors to an output terminal of said circuit; and
   feedback means disposed between the input electrode and the output electrode of at least one of said transistors for providing a negative feedback path about said at least one transistor; and
   wherein said feedback means includes a field effect transistor having source drain and gate electrodes with the source and drain electrode thereof copuled between input and output terminals of the at least one transistor.

4. The circuit, as recited in claim 1, wherein said feedback circuit includes an inductor and a capacitor coupled in series between the input and the output electrodes of the at least one transistor.

5. The circuit, as recited in claim 1, wherein said feedback circuit includes an inductor coupled in parallel with a capacitor, with said inductor and capacitor being coupled between the drain and source electrodes of the at least one transistor.

6. A radio frequency amplifier comprising:
   a plurality of field effect transistors, each one of said transistors having an input electrode and an output electrode;
   an input propagation means for successively coupling the input electrodes of each one of said plurality of transistors to an input terminal of said radio circuit;
   an output propagation means for succesively coupling the output electrodes of each one of said transistors to an output electrode of said amplifier; and
   a plurality of feedback circuits, each feedback circuit disposed to couple the output electrode of a corresponding one of said plurality of transistors to the corresponding input electrode of said plurality of field effect transistors.

7. The circuit, as recited in claim 6, wherein said feedback circuit includes a resistor disposed in series with a capacitor between the input and output electrode of said corresponding transistor.

8. The circuit as recited in claim 1 wherein said transistors are metal semiconductor field effect transistors.

9. The circuit, as recited in claim 1, wherein said transistors are high electron mobility transistors.

10. The circuit, as recited in claim 6, wherein said transistors are metal semiconductor field effect transistors.

11. The circuit, as recited in claim 6, wherein said transistors are high electron mobility transistors.

* * * * *